United States Patent [19]

Lyyra

[11] Patent Number: 4,849,686
[45] Date of Patent: Jul. 18, 1989

[54] METHOD OF AND ARRANGEMENT FOR ACCURATELY MEASURING LOW CAPACITANCES

[75] Inventor: Matti Lyyra, Vantaa, Finland
[73] Assignee: Vaisala Oy, Finland
[21] Appl. No.: 14,661
[22] Filed: Feb. 13, 1987

[30] Foreign Application Priority Data

Feb. 13, 1986 [FI] Finland .................................. 860668

[51] Int. Cl.$^4$ ............................................. G01R 27/02
[52] U.S. Cl. .................................. 324/60 R; 324/57 R; 73/1 R
[58] Field of Search ........... 340/870.04, 870.1, 870.13, 340/870.37; 364/571; 324/57 R, 60 R, 61 R, 63; 73/1 R

[56] References Cited

U.S. PATENT DOCUMENTS 2,753,547 7/1956 Donath ........................... 340/870.04
3,268,665 8/1966 Miller .............................. 340/870.04

OTHER PUBLICATIONS

Gruenberg: "Handbook of Telemetry & Remote Control"-McGraw Hill 1973-Chapters 6 and 12.
Borden: "Telemetering Systems"-Reinhold-pp. 256-258, published co. 1960.

Primary Examiner—Reinhard J. Eisenzopf
Assistant Examiner—Jose M. Solis
Attorney, Agent, or Firm—Steinberg & Raskin

[57] ABSTRACT

A third reference capacitor cooperates with first and second reference capacitors to minimize measurement errors in a measurement circuit of the type in which reference and measurement capacitors are connected, one at a time, to an oscillator of the measurement circuit to generate an output frequency proportional to the capacitance of the capacitor being measured. The measurement errors introduced by different temperature and loading conditions during calibration and measurement modes of the measurement circuit are minimized.

4 Claims, 6 Drawing Sheets

METHOD OF AND ARRANGEMENT FOR ACCURATELY MEASURING LOW CAPACITANCES

BACKGROUND OF THE INVENTION

1. Field of the Invention

This invention generally relates to a method of and arrangement for accurately measuring low capacitances and, more particularly, to the accurate measurement of capacitances less than 100 pF despite changing operating conditions between calibration and measurement modes of operation of a measurement circuit.

2. Description of Related Art

In radiosondes, capacitance detectors are used to measure various physical parameters, e.g. atmospheric pressure, temperature, humidity, etc. The magnitude of the measured capacitance indicates the value of the parameter. The capacitances of these detectors are relatively low, from a few pF to a few dozen pF, or, at the maximum, about 100 pF. The measurement of such low capacitances is not always accurate owing to stray capacitance, variations in supply voltage, changes in the external temperature, and other disturbances.

Reference can be had to U.S. Pat. Nos. 4,295,090 and 4,295,091, as well as U.S. patent application Ser. Nos. 739,325; 739,326 and 739,314 for details of known measurement circuits for measuring low capacitances by connecting a measurement capacitor, and one or more reference capacitors, one at a time, to an oscillator whose output frequency is proportional to the connected capacitor.

Although generally satisfactory for their intended purpose, the known measurement circuits have a measurement response characteristic which varies as a function of different operating conditions, thereby leading to unacceptable inaccurate measurements. For example, the measurement circuits of the aforementioned patents and applications are initially operated in a calibration mode of operation, and thereupon, after a predetermined time, in a measurement mode of operation. If the temperature of the measurement circuit and/or of the reference and/or measurement capacitors is different during the calibration and subsequent measurement modes of operation, the accuracy of measurement is compromised. If the loading impedance of the oscillator of the measurement circuit is different during the calibration and subsequent measurement modes of operation, then, again, measurement inaccuracies result.

SUMMARY OF THE INVENTION

1. Objects of the Invention

It is a general object of this invention to overcome the drawbacks of prior art low capacitance measurement circuits.

It is another object of this invention to accurately measure low capacitances despite changing operating conditions between calibration and measurement modes of operation of a measurement circuit.

A further object of this invention is to accurately measure low capacitances despite temperature and/or loading condition variations in the measurement circuit.

Still another object of this invention is to minimize, if not eliminate, the effect of a defective measurement capacitor serving as a detector of some parameter on other measurement capacitors.

2. Features of the Invention

In keeping with these objects, and others which will become apparent hereinafter, one feature of this invention resides, briefly stated, in a method of, and an arrangement for, accurately measuring low impedance values of measurement impedances, e.g. capacitors.

First and second reference impedances are selected with impedance values respectively at lower and upper regions of an impedance measurement range. A third reference impedance is selected with an impedance value at an intermediate region between the lower and upper regions of the measurement range. Preferably, but not necessarily, the third impedance is midway between the first and second impedances.

A measuring circuit is operable in calibration and measurement modes of operation. The measuring circuit is connected to each reference impedance and measurement impedance for measuring the impedance value of a selected measurement impedance. The measuring circuit has a variable response characteristic as a function of different operating conditions during the calibration and measurement modes. For example, as previously noted, the temperature and/or loading conditions may be different during the calibration and subsequent measurement operational modes.

An initial correction parameter is determined by connecting each reference impedance, one at a time, to the measuring circuit during the calibration mode. This initial correction parameter is a function of each reference impedance. The initial correction parameter is stored, preferably in a memory chip. An updated correction parameter is then determined by connecting each reference impedance, one at a time, to the measuring circuit during the measurement mode. The updated correction parameter is also a function of each reference impedance. The updated correction parameter is then compared to the initial correction parameter. A correction factor based on the difference between the updated and initial correction parameters is then stored, again in a memory chip.

The impedance value of the measurement impedance is measured by connecting the latter to the measuring circuit during the measurement mode. A corrected impedance value for the measurement impedance is then determined as a function of the measured impedance value and the correction factor.

This invention thus reduces measurement errors caused by the variable response characteristic due to the different operating conditions of the measurement circuit. The use of a third reference impedance to correct the measured impedance permits measurement errors to be reduced to one tenth or less than that which was otherwise achievable by the measurement circuit using but two reference impedances.

The novel features which are considered as characteristic of the invention are set forth in particular below. The invention itself, however, both as to its construction and its method of operation, together with additional objects and advantages thereof, best will be understood from the following description of specific embodiments when read in connection with the accompanying drawings.

DETAILED DESCRIPTION OF THE PREFERRED EMBODIMENTS

Figure 1A:
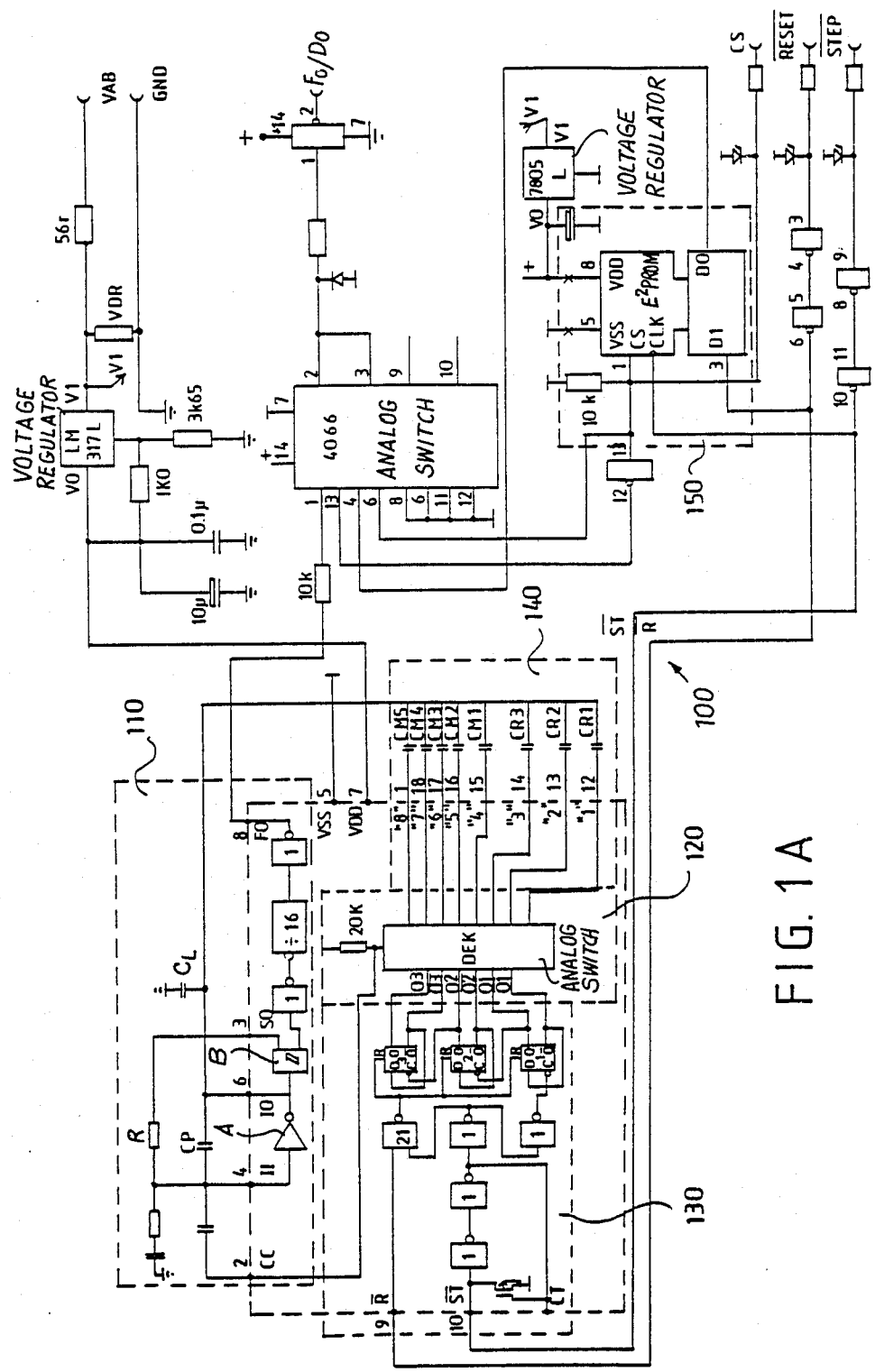
FIG. 1A is an electrical schematic of a measuring circuit in accordance with the method of this invention.
Figure 1B:
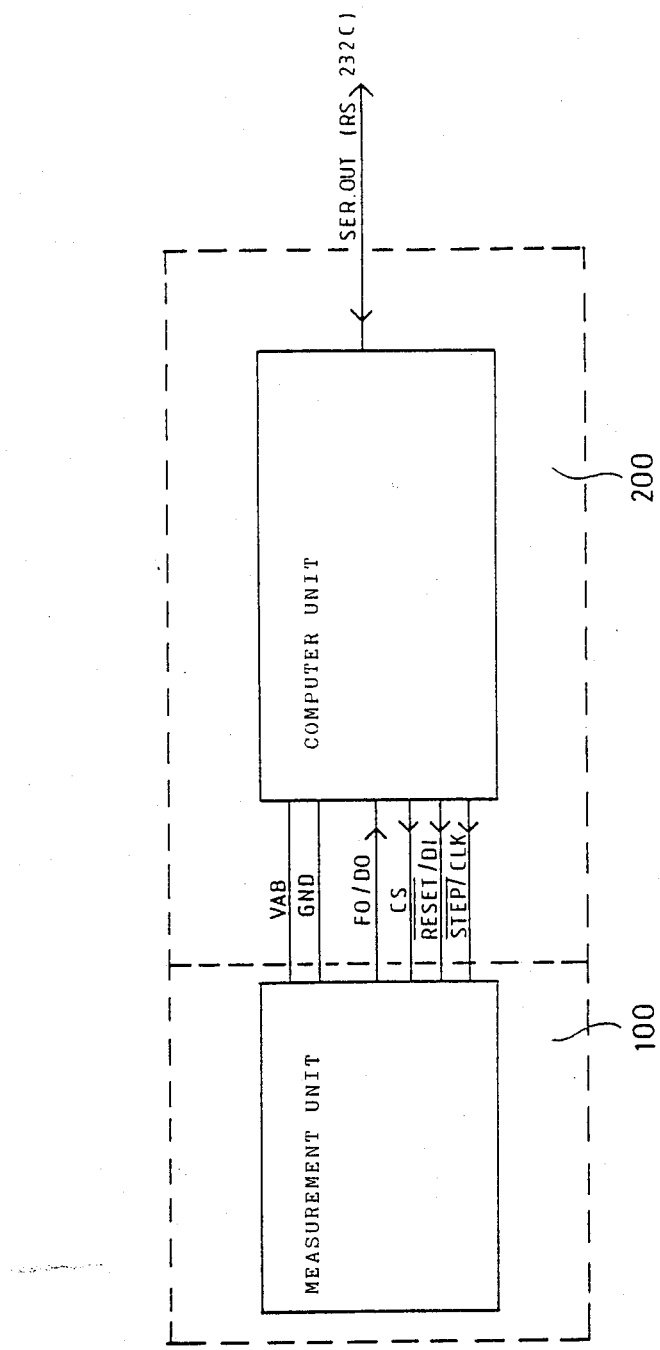
FIG. 1B is a block diagram of the measuring circuit of FIG. 1A connected to a computer unit.
Figure 1C:
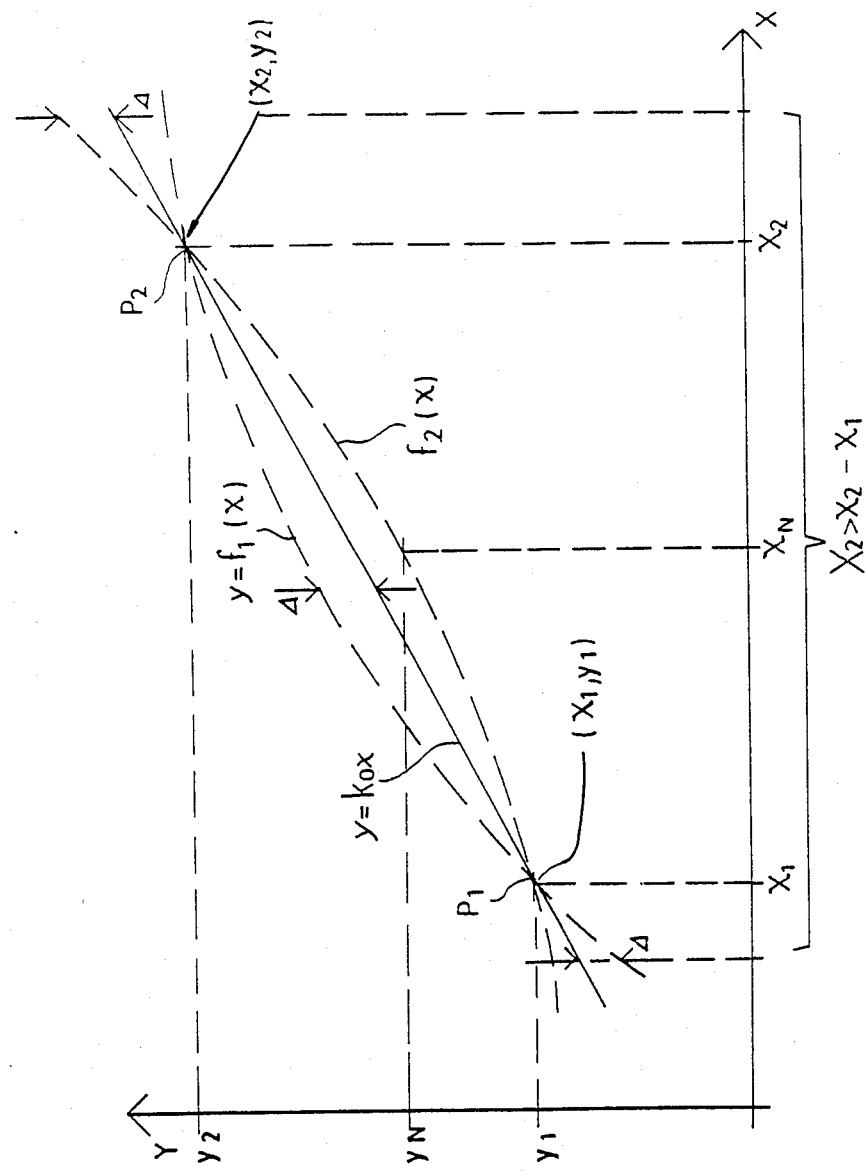
FIG. 1C is a graph depicting an ideal and an actual measurement response characteristic of a measurement circuit employing two reference impedances in accordance with the prior art.

Referring first to FIG. 1C the linear (ideal) and non-linear (actual) measurement response characteristics of a measurement circuit of the type described in the above-identified U.S. patents and patent applications, the entire contents of which are hereby incorporated herein by reference, are plotted on a two-coordinate graph. The X-axis indicates the value of the capacitance to be connected to the measurement circuit; the Y-axis indicates the measured value of the connected capacitance. A first reference capacitor having coordinates $x_1$, $y_1$ is plotted as point $P_1$; a second reference capacitor having coordinates $x_2$, $y_2$ is plotted as point $P_2$. The straight line $y = k_o x$ between points $P_1$ and $P_2$ is the ideal measurement response characteristic, but, in practice, owing to individual non-linearities in the measurement circuit components as well as to variations in conditions external to the measurement circuit, the measurement response characteristic varies on both sides of the straight line between the curves $y = f1(x)$ and $y = f2(x)$ within error margins $\Delta$ within the measurement range X which is greater than $x_2 - x_1$.

A transition error can occur causing the points $P_1$ and $P_2$ to shift along the X-axis. A sensitivity error can occur causing the points $P_1$ and $P_2$ to shift along the Y-axis. The transition error can be minimized, if not eliminated, by fixing the coordinates of point $P_1$. The sensitivity error can be minimized, if not eliminated, by fixing the coordinates of point $P_2$.

Turning now to the invention, as depicted in FIGS. 1A and 1B, a measuring circuit 100 includes a measurement oscillator 110, analog switching circuit 120, control logic circuit 130, reference and measurement impedance block 140, and memory circuit 150. The measuring circuit 100 is connected by connecting lines labeled VAB, GND, FO/DO, CS, RESET/DI and STEP/CLK to a computer unit 200.

The oscillator 110 includes, as described in the aforementioned patents and applications, an inverting amplifier A and a Schmitt trigger B which together with resistor R and capacitor $C_P$, generate an oscillating signal having an output frequency proportional to the particular capacitance from the block 140 which has been connected to the oscillator 110 by switching circuit 120 under the control of the control circuit 130.

The impedance block 140 includes three reference capacitors CR1, CR2 and CR3, as well as five measurement capacitors CM1, CM2, CM3, CM4 and CM5. The control circuit 130 connects each reference capacitor and measurement capacitor, one at a time, in a predetermined sequence to the oscillator. Each output frequency of the oscillator is proportional to the capacitance value of each connected capacitor.

As previously mentioned, two reference capacitors such as CR1 and CR2 were previously used in prior art measuring circuits, and were selected to be at lower and upper regions of the measurement range. According to this invention, at least a third reference capacitor, i.e. CR3, is selected intermediate, preferably midway or substantially so, the lower and upper range regions. This third reference capacitor is used to improve the accuracy of the measured capacitance, particularly in those situations where the measuring circuit 110 and/or capacitors in block 140 are subjected to different temperatures during calibration and measurement modes, or different loading conditions.

Figure 2:
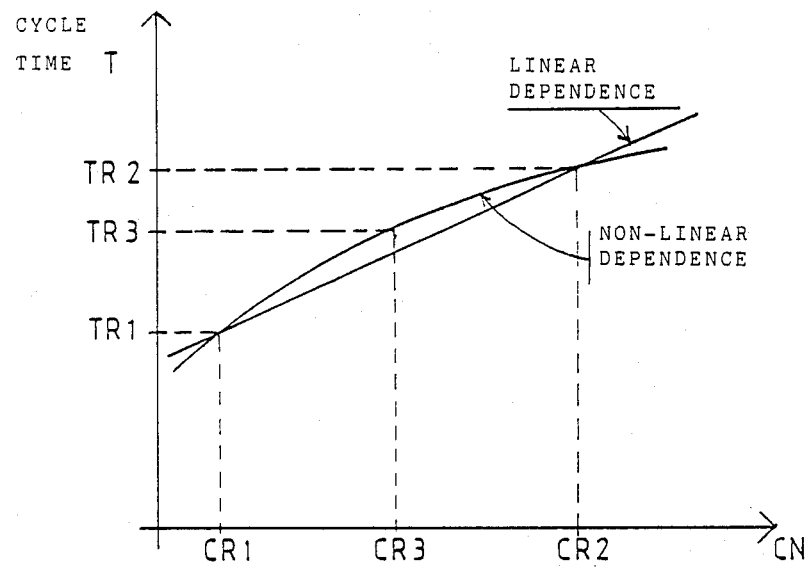
FIG. 2 is a graph of cycle time versus capacitance for the measuring circuit of FIG. 1A depicting linear and non-linear response characteristics.

The cycle time T plotted in FIG. 2 is inversely proportional to the output frequency of the oscillator. Using the subscript N to generally denote each measurement capacitor where N = 1, 2, 3, 4 or 5, then it can be shown that:

$$T_N = A_o + A_1(C_P + C_N) + A_2(C_P + C_N)^2 \quad (1)$$

wherein $A_o$, $A_1$ and $A_2$ are constants during the rapid measurement cycle which lasts, for example,
100 ms, but change slowly between measurement cycles, e.g. 1 sec;
$C_P$ is the base capacitance of the oscillator; and
$C_N$ is the capacitance to be connected, i.e. CR1, CR2, CR3, CM1, CM2, CM3, CM4 or CM5.

The term $A_2(C_P + C_N)^2$ in Equation (1) is a nonlinear term and the change in the value of this term between measurement cycles cannot be eliminated by the employment of only two reference capacitors. It is only the change in the values of $A_o$ and $A_1$, which have heretofore been eliminated by the employment of two reference capacitors. More specifically, if it is desired to measure accurately the capacitance CM (e.g. CM1, CM2, CM3, CM4, or CM5), the prior art reference capacitors $CR_1$ and $CR_2$ and the measurement capacitance CM are connected alternately in succession to the oscillator, and the corresponding cycle times $TCR_1$, $TCR_2$ and $TC_M$ are measured with the aid of the computing unit 200 (FIG. 1B).

Then, assuming $A_2 \approx 0$, it follows from Equation (1) that:

$$TCR_1 = A_0 + A_1(C_P + CR1)$$

$$TCR_2 = A_0 + A_1(C_P + CR2)$$

$$TCM = A_0 + A_1(C_P + CM)$$

Since the measurement is made fast in succession (t=100 ms), the terms $A_0$ and $A_1$ remain constant.

A so-called "Y-value" YM corresponding to the capacitance CM to be measured in the measuring cycle in question is defined and calculated on the basis of the above values, as follows:

$$YM = \frac{TCR_2 - TCM}{TCR_2 - TCR_1} = \quad (2)$$

$$\frac{A_0 + A_1(Cp + CR2) - A_0 - A_1(Cp + CM)}{A_0 + A_1(Cp + CR2) - A_0 - A_1(Cp + CR1)} =$$

$$\frac{CR2 - CM}{CR2 - CR1}$$

Hence, the effect of $A_0$ and $A_1$ is eliminated.
Equation (2) can be rewritten as:

$$CM = CR2 - YM(CR2 - CR1) \quad (3)$$

The accuracy of the measured capacitance is determined by the accuracy and stability of the references CR1 and CR2. In computation, the Y-value YM is generally used directly in place of the capacitance CM.

The condition for the accuracy of the above calculation is that the term $A_2(Cp+CN)^2 = 0$ in Equation (1). If the variation range of the measured capacitance CM is large ($\Delta CM > 20$ pF) and the measuring circuit is used at a temperature which is significantly different from that used in the calibration, or the loading of the oscillator changes (capacitor CL, FIG. 1A, block 110), then after calibration the change in question affects the term $A_2(Cp+CN)^2$, and its effect cannot be eliminated by the above calculation of YM. See Equations (2) and (3). The non-linearity caused by the term $A_2(Cp+CN)^2$ cannot be eliminated by the use of two reference capacitors, as taught by the prior art, even though it causes a measuring error in capacitance measurement (error=0.01 ... 0.1% $\Delta CM$).

In order to eliminate the error introduced by the term $A_2(Cp+CN)^2$, the third reference capacitor CR3 is measured during the calibration mode wherein TCR1, TCR2, TCR3 and TCM are measured. The Y-value (initial correction parameter) of the third reference capacitor CR3 is calculated by means of computer unit 200 as follows:

$$YCR3 = \frac{CR2 - CR3}{CR2 - CR1} \quad (4)$$

This initial correction parameter YCR3 is stored in memory 150.

During each following measurement cycle, the Y-value of the third reference capacitor CR3 is recalculated as per Equation (4) as a function of the updated measurements of the first and second reference capacitors. If the Y-value has changed, then the changed Y-value, now known as an updated correction parameter YCR3', is compared to the initial correction parameter YCR3, to generate a correction factor $\Delta Y3$, as follows:

$$\Delta Y3 = YCR3 - YCR3' \quad (5)$$

Figure 3:
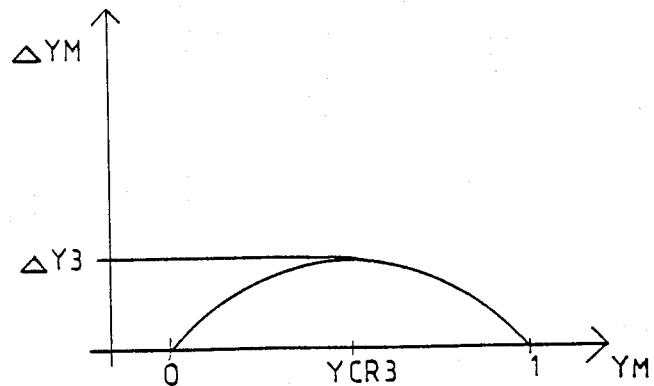
FIG. 3 is a graph of correction factor versus correction parameter for the measuring circuit of FIG. 1A depicting the measurement inaccuracy caused by the non-linear response characteristic of the measuring circuit.

The correction factor $\Delta Y3$ is stored in memory 150, and is shown in FIG. 3 wherein an overall correction parameter $\Delta YM$ is plotted versus the initial correction parameter YM. It can be shown that:

$$\Delta YM = \frac{\Delta Y3}{YCR3'(YCR3' - 1)} YM(YM - 1) \quad (6)$$

whereby the final (precise) Y-value (Y'M) of the measurement capacitance CM that is being measured can be calculated as follows:

$$Y'M = YM\left[1 + \frac{\Delta Y3(YM - 1)}{YCR3'(YCR3 - 1)}\right] \quad (7)$$

The above method does not eliminate the effect of the term $A_2(CP+CN)^2$ on non-linearity, but its effect is "summated" to the non-linearity of the capacitor being measured, and the calibration equation "linearizes" it. The essential thing is that the effect of the change of the term $A_2(Cp+CN)^2$ is eliminated during and after the calibration, and the method in question accomplishes this result with the aid of the constant CR3. The accuracy of the correction is determined by the constants CR1, CR2 and CR3.

The non-linearity is first "locked" by the constant CR3, and after that the changed non-linearity is corrected to the said locked value.

By way of example, to better illustrate the invention:

EXAMPLE 1

Figure 4:
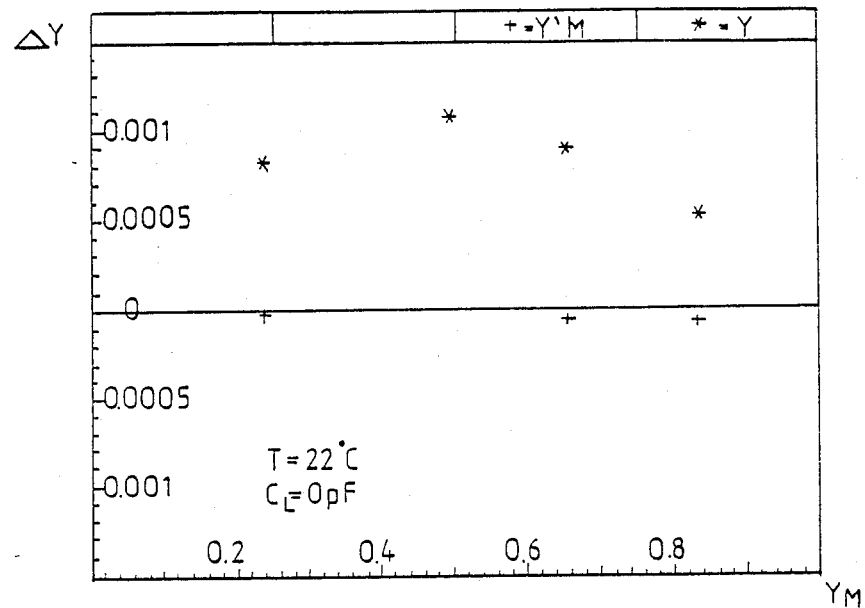
FIG. 4 is a graph of correction factor versus correction parameter depicting uncorrected and corrected measurement results in one operating condition wherein the effect of a change in the loading capacitance of the measuring circuit of FIG. 1A is plotted.
Figure 5:
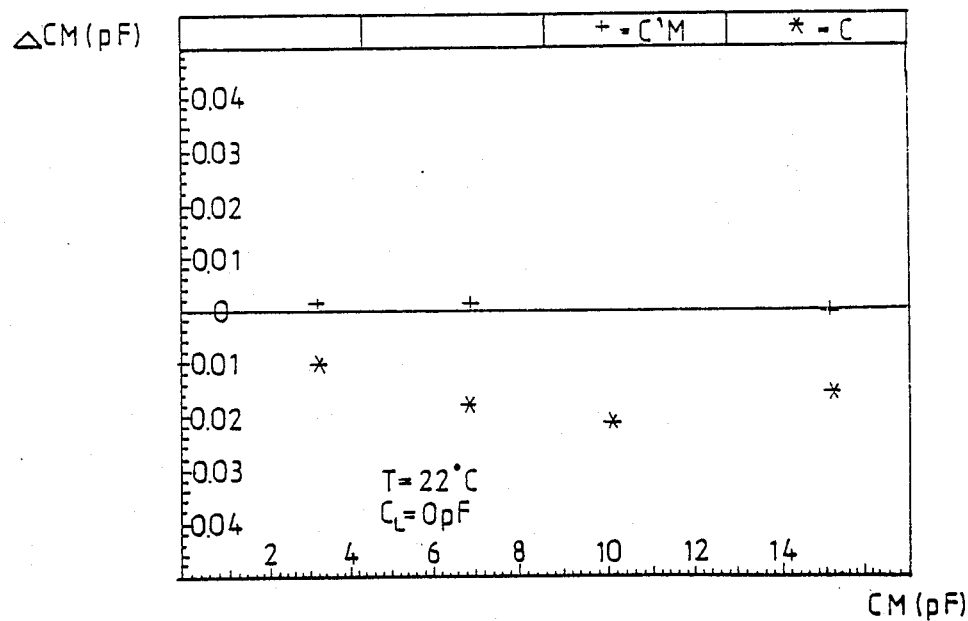
FIG. 5 is a graph of the change in capacitance versus the capacitance being measured for the condition of FIG. 4.

With reference to FIGS. 4 and 5, the first test example of the accuracy obtainable by the method of the invention is plotted, wherein the following values were chosen:

CR2=20 pF
CR1=0 pF
CR3=10 pF
ambient temperature of environment TA=23° C.
load capacitor on oscillator CL=100 pF The measurements of EXAMPLE 1 were made by means of four measurement capacitors CM1 to CM4, which were standard capacitors encapsulated in glass.

Figure 6:
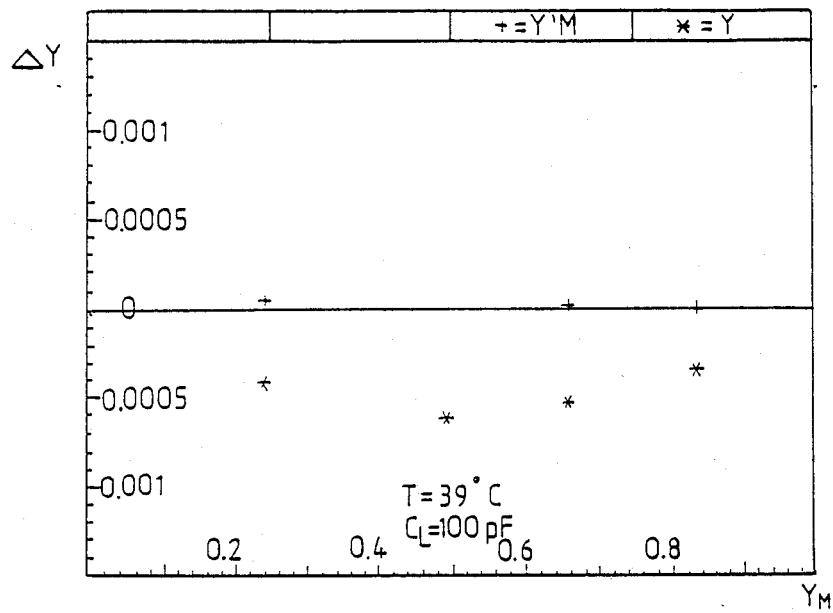
FIG. 6 is a graph of correction factor versus correction parameter depicting uncorrected and corrected measurement results in another operating condition wherein the effect of a change in the temperature of the measuring circuit of FIG. 1A is plotted.
Figure 7:
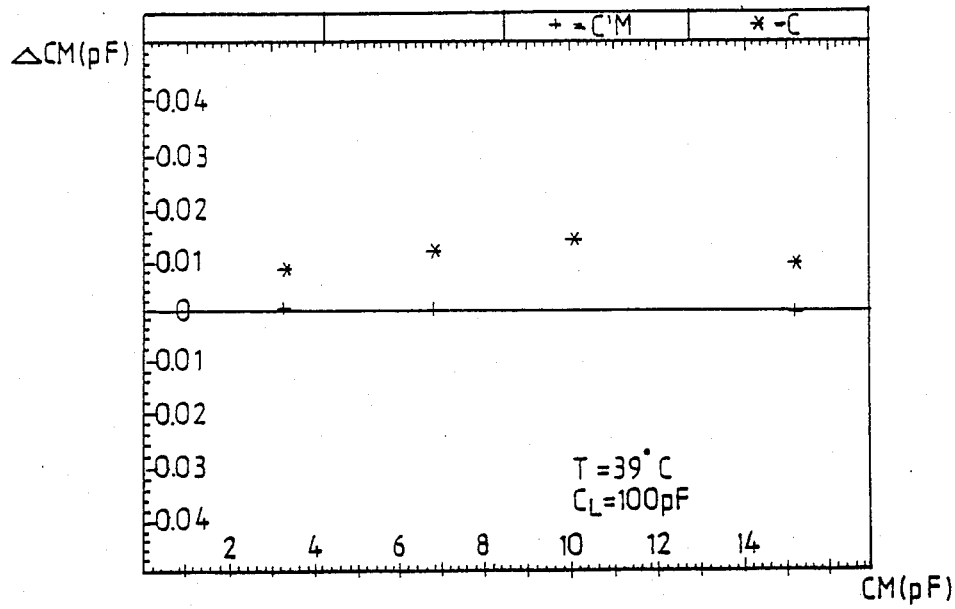
FIG. 7 is a graph of the change in capacitance versus the capacitance being measured for the condition of FIG. 6.

During the measurement, the loading capacitance of the oscillator was changed CL=100 pF→0 pF. In FIG. 4, as well as FIGS. 5-7, the measurement results are shown as follows:

* *=uncorrected error of Y-values produced by means of calculations based on two reference capacitors in accordance with the prior art,
* +=corrected error of Y-values obtained with three reference capacitors in accordance with the invention.

FIG. 5 illustrates the change in the capacitance $\Delta CM$ to be measured (the measurement error) as a function of the capacitance (CM) to be measured when CL=100 pF→0 pF.

The magnitude of the measurement error of each capacitance CM can be calculated as follows:

$$CM = CR2 - YM(CR2 - CR1)$$

$$\frac{dCM}{dYM} = (CR2 - CR1)$$

$$\Delta CM = (CR2 - CR1) \times YM$$

From FIG. 4, the maximum corrected error can be obtained as $\Delta YM - 0.0001$.
From FIG. 5, the maximum measurement error is:

$$\Delta CM = 0.0001 \times 20 \ pF = 2 \ fF \ (f = 10^{-15})$$

Hence, the sensitivity of a pressure capacitive detector is about 1.4 fF/hPa.

The change in the loading capacitor CL described in Example 1 illustrated the situation in which any one of the measurement capacitors to be measured becomes defective and is short-circuited, thereby simulating a malfunction situation.

EXAMPLE 2

The starting values are the same as in Example 1. In this case, the temperature of the ambient environment goes from 22° C. to −39° C. The results are plotted in FIGS. 6 and 7 in a way corresponding to that of FIGS. 4 and 5.

Example 2 simulates the situation in which the measurement capacitive detector to be measured and the measuring electronics are subjected to different temperatures in relation to each other, as compared with the calibration situation.

By means of the method of the invention, the accuracy of measurement can be improved despite changing temperature and loading conditions. Moreover, the effect of a defective detector on the other detectors in the same measurement electronics can be eliminated. By means of the method of the invention, e.g. a pressure transmitter can be accomplished whose range of measurement is very wide, by using several pressure detectors. A short-circuiting of more sensitive detectors does not affect the operation of the measuring detectors at the upper end of the range of measurement (higher pressures). The method of the invention can be used favorably for self-diagnostics of the measurement electronics.

In accordance with the invention, by using a third reference impedance, a non-linear dependence of the parameter YM of the measurement circuit from the impedance to be measured can be eliminated. In accordance with the invention, by using a third constant reference impedance, it is possible to make the effect of said non-linearity remain invariable, even if the nonlinearity itself should change in relation to the variations taking place in the loading, temperature, or other factors in the measurement circuit.

Even though a third reference impedance CR3 has been spoken of, it is to be understood that, in some special applications, the third reference may be replaced by two or more third reference impedances whose joint effect is similar to the effect of one third reference as described above. As a rule, it is, however, preferable to use one third reference impedance only.

It will be understood that each of the elements described above, or two or more together, also may find a useful application in other types of constructions differing from the types described above.

While the invention has been illustrated and described as embodied in a method of and arrangement for accurately measuring low capacitances, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the invention.

I claim:

1. A method of accurately measuring physical quantities using measurement impedances having low impedance values, comprising the steps of:
    (a) selecting first and second stable reference impedance with impedance values respectively at lower and upper regions of an impedance measurement range;
    (b) selecting a third stable reference impedance with an impedance value at an intermediate region between the lower and upper regions of the measurement range;
    (c) determining an initial correction parameter by connecting each reference impedance, one at a time, to a measuring circuit during calibration mode, said initial correction parameter being a function of each reference impedance and of operating conditions of calibration environment;
    (d) storing the initial correction parameter;
    (e) providing a measuring circuit connectable in calibration and measurement modes of operation to each reference impedance and measurement impedance for measuring the impedance value of a selected measurement impedance, said measuring circuit having a variable response characteristic as a function of different operating conditions during the calibration and measurement modes;
    (f) determining an updated correction parameter by connecting each reference impedance, one at a time, to the measuring circuit during the measurement mode, said updated correction parameter being a function of each reference impedance;
    (g) comparing the updated correction parameter with the initial correction parameter, and storing a correction factor based on the difference between the updated and initial correction parameters;
    (h) measuring the impedance value of the measurement impedance by connecting the latter to the measuring circuit during the measurement mode; and
    (i) determining a corrected impedance value for the measurement impedance as a function of the impedance value measured in step (h) and the correction factor, thereby reducing measurement errors caused by the variable response characteristic due to the different operating conditions.

2. The method as recited in claim 1, wherein step (c) is performed by calculating a ratio, the numerator of which is the difference between the second reference impedance and the measurement impedance, the denominator of which is the difference between the two reference impedances.

3. The method as recited in claim 1, wherein each impedance is a low capacitance whose value is indicative of a variable physical quantity.

4. An arrangement for accurately measuring physical quantities using measuring impedance having low impedance values, comprising:
    (a) first and second stable reference impedances with impedance values respectively at lower and upper regions of an impedance measurement range;
    (b) a third stable reference impedance with an impedance value at an intermediate region between the lower and upper regions of the measurement range;

(c) means for determining an initial correction parameter by connecting each reference impedance, one at a time, to a measuring circuit during calibration mode, said initial correction parameter being a function of each reference impedance and of operating conditions of calibration environment;

(d) means for storing the initial correction parameter;

(e) a measuring circuit connectable in calibration and measurement modes of operation to each reference impedance and measurement impedance for measuring the impedance value of a selected measurement impedance, said measuring circuit having a variable response characteristic as a function of different operating condition during the calibration and measurement modes;

(f) means for determining an updated correction parameter by connecting each reference impedance, one at a time, to the measuring circuit during the measurement mode, said updated correction parameter being a function of each reference impedance;

(g) means for comparing the updated correction parameter with the initial correction parameter, and storing a correction factor based on the difference between the updated and initial correction parameters;

(h) means for measuring the impedance value of the measurement impedance by connecting the latter to the measuring circuit during the measurement mode; and (i) means for determining a corrected impedance value for the measurement impedance as a function of the measured impedance value and the correction factor, thereby reducing measurement errors caused by the variable response characteristic due to the different operating conditions.

* * * * *